(12) United States Patent
Maeda

(10) Patent No.: US 10,249,371 B2
(45) Date of Patent: Apr. 2, 2019

(54) CONTROL CIRCUIT, SEMICONDUCTOR STORAGE DEVICE, AND METHOD OF CONTROLLING SEMICONDUCTOR STORAGE DEVICE

(71) Applicant: FUJITSU LIMITED, Kawasaki-shi, Kanagawa (JP)

(72) Inventor: Masazumi Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/718,029

(22) Filed: Sep. 28, 2017

(65) Prior Publication Data
US 2018/0122480 A1 May 3, 2018

(30) Foreign Application Priority Data
Nov. 1, 2016  (JP) ................. 2016-214455

(51) Int. Cl.
| | | |
|---|---|---|
| G11C 16/00 | (2006.01) | |
| G11C 16/04 | (2006.01) | |
| G11C 16/10 | (2006.01) | |
| G11C 16/28 | (2006.01) | |
| G11C 29/00 | (2006.01) | |
| G11C 29/44 | (2006.01) | |
| G11C 29/52 | (2006.01) | |

(Continued)

(52) U.S. Cl.
CPC ...... *G11C 16/0483* (2013.01); *G06F 12/0246* (2013.01); *G11C 11/5628* (2013.01); *G11C 16/107* (2013.01); *G11C 16/28* (2013.01); *G11C 29/4401* (2013.01); *G11C 29/52* (2013.01); *G11C 29/72* (2013.01); *G11C 29/789* (2013.01); *G11C 29/765* (2013.01); *G11C 2211/5641* (2013.01); *G11C 2216/24* (2013.01)

(58) Field of Classification Search
CPC ... G11C 16/0483; G11C 16/107; G11C 16/28; G11C 11/5628; G11C 29/4401; G11C 29/52; G11C 29/72; G11C 29/789; G11C 29/765
See application file for complete search history.

(56) References Cited

U.S. PATENT DOCUMENTS

| | | | | |
|---|---|---|---|---|
| 2008/0112222 | A1* | 5/2008 | Shirakawa | G11C 11/5621 365/185.03 |
| 2010/0332922 | A1* | 12/2010 | Chang | G06F 12/0246 714/704 |
| 2011/0019470 | A1 | 1/2011 | Shibata et al. | |

FOREIGN PATENT DOCUMENTS

| | | |
|---|---|---|
| JP | 2008-123330 | 5/2008 |
| JP | 2011-028793 | 2/2011 |

* cited by examiner

*Primary Examiner* — Tha-O H Bui
*Assistant Examiner* — Alfredo Bermudez Lozada
(74) *Attorney, Agent, or Firm* — Fujitsu Patent Center

(57) ABSTRACT

A control circuit that controls a memory including a storage region and a redundant region, the control circuit includes a detector that detects a defective block in the memory, and a controller that switches, when the detector has detected the defective block, a data storage scheme of the first block detected as the defective block from a first storage scheme to a second storage scheme in which the number of bits of data to be stored in each of memory elements is smaller than the number of bits of data to be stored in each of the memory elements in the first storage scheme, and that stores a portion of data stored in the first block in the first storage scheme to be stored in the first block in the second storage scheme.

13 Claims, 9 Drawing Sheets

(51) Int. Cl.
*G06F 12/02* (2006.01)
*G11C 11/56* (2006.01)

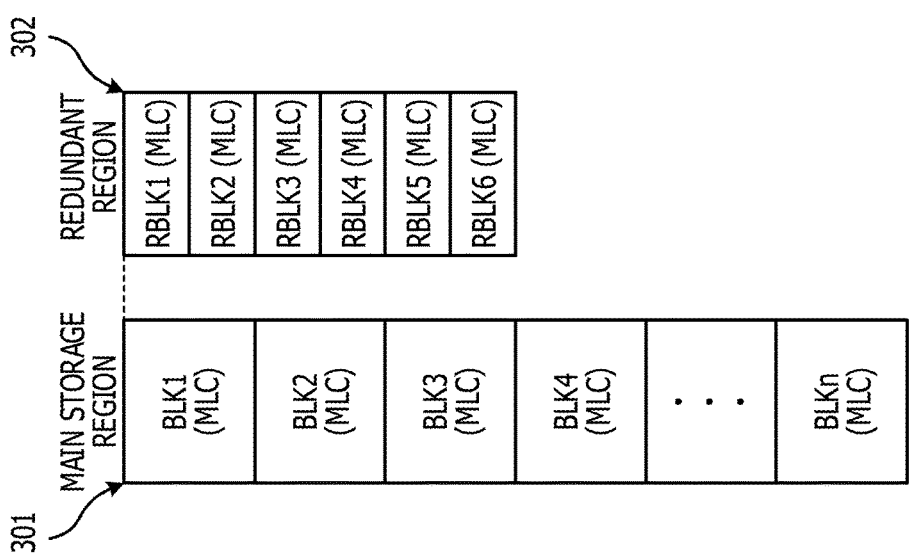
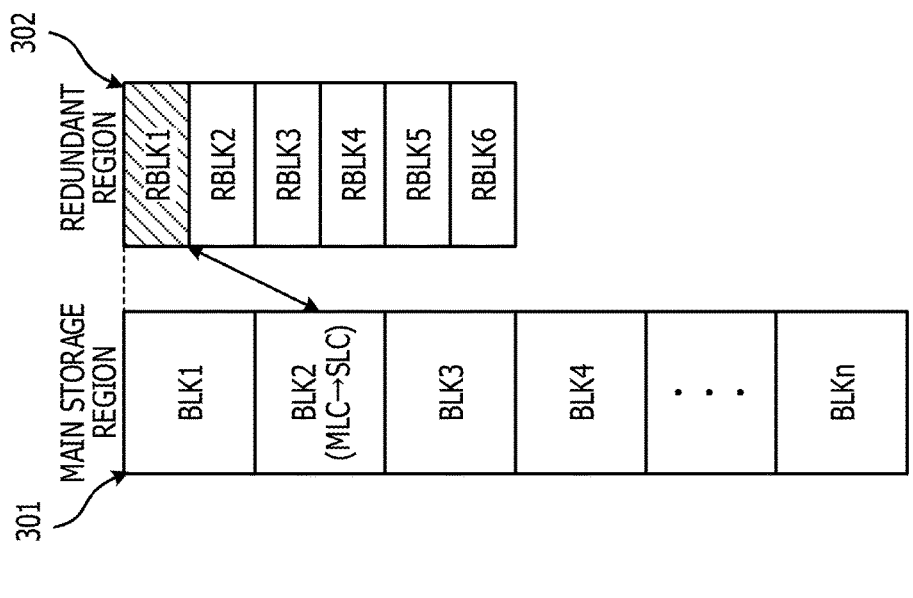

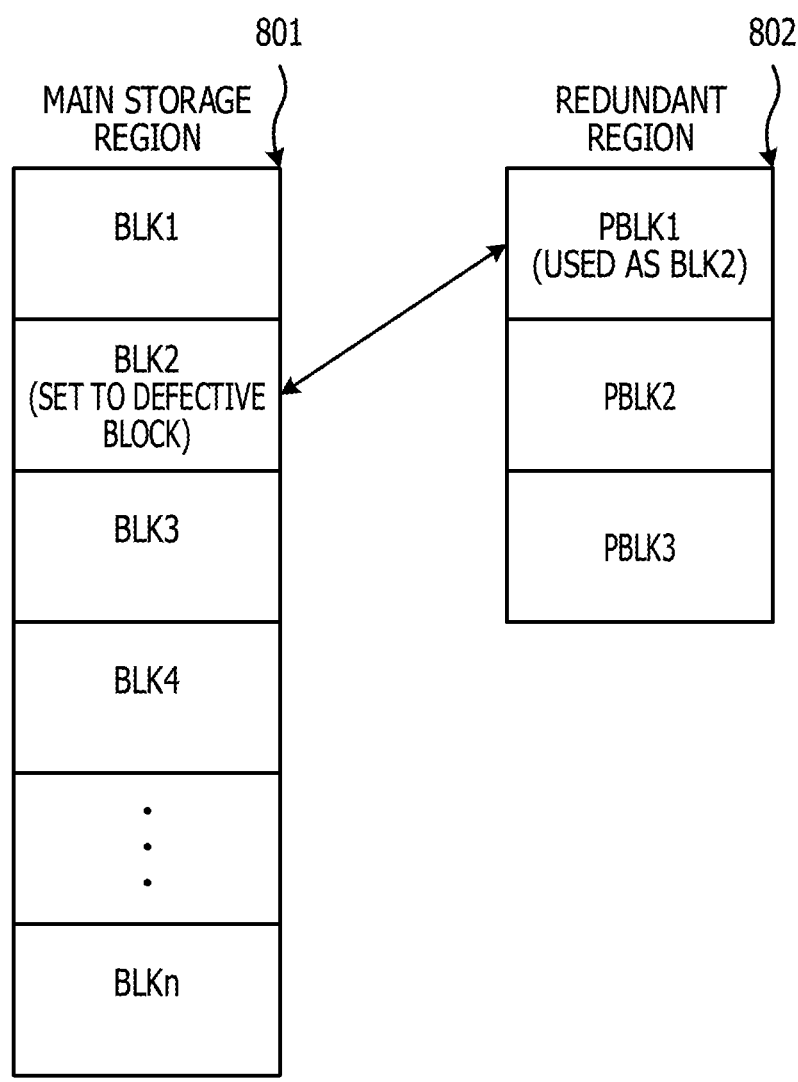

CONTROL CIRCUIT, SEMICONDUCTOR STORAGE DEVICE, AND METHOD OF CONTROLLING SEMICONDUCTOR STORAGE DEVICE

CROSS-REFERENCE TO RELATED APPLICATION

This application is based upon and claims the benefit of priority of the prior Japanese Patent Application No. 2016-214455, filed on Nov. 1, 2016, the entire contents of which are incorporated herein by reference.

FIELD

The embodiment discussed herein is related to a control circuit, a semiconductor storage device, and a method of controlling a semiconductor storage device.

BACKGROUND

Nonvolatile memories are used in server devices, personal computers, mobile devices, and storage devices represented by solid state drives (SSDs) and the like. As the nonvolatile memories, there are flash memories, ferroelectric random access memories (FeRAMs), and magnetoresistive random access memories (MRAMs). For example, flash memories are implemented in SSDs, and data is electrically stored in and read from the flash memories. The SSDs with the flash memories consume low power and have high shock resistance, while the sizes, thicknesses, and weights of devices including the SSDs may be small. Thus, in recent years, SSDs have been used as storage systems in a large number of devices.

As an example of a nonvolatile memory element, an example of the configuration of each of memory elements of a flash memory is illustrated in FIG. 7A. A source 702 and a drain 703 are formed on a substrate 701, and a floating gate 705 is formed above the substrate 701, the source 702, and the drain 703 with an insulating layer 704 interposed between the floating gate 705 and the substrate 701, the source 702, and the drain 703. In addition, a control gate 706 is formed above the floating gate 705 with the insulating layer 704 interposed between the control gate 706 and the floating gate 705. Each of the memory elements of the flash memory is constituted by a transistor with the floating gate, controls a source voltage Vs, a drain voltage Vd, and a gate voltage Vg, injects and extracts electrons into and from the floating gate 705, and controls a threshold voltage of the transistor, thereby achieving data storage.

An example of distributions of threshold voltages Vth of the memory elements of the flash memory is illustrated in FIG. 7B. In FIG. 7B, the abscissa indicates a threshold voltage, and the ordinate indicates the number of memory elements. In each memory element of the flash memory, every time data is written and deleted, an insulating layer 704 is damaged and a variation in a threshold voltage Vth increases. As indicated by solid lines 710A and 711A, in a state in which the number of times of data writing is small and insulating layers 704 are hardly damaged, variations in the threshold voltages Vth are small.

After that, when data writing and data deletion are repeatedly executed and the damage of the insulating layers 704 progresses, the variations in the threshold voltages Vth increase as indicated by broken lines 710B and 711B. Then, when the threshold voltages Vth for different data items overlap each other as indicated by 712, the data items may not be appropriately determined and may become defective. Since the memory elements of the flash memory are degraded for each time of data writing, the life of the rewritable flash memory is shorter than those of magnetic disks. Thus, in order to average the numbers of times of writing in memory elements included in an SSD, a controller included in the SSD executes control that is referred to as wear leveling.

There have been an increasing number of cases where Multiple Level Cell (MLC), in which data of 3 or more values or multiple bits is stored in each memory element, is applied from the perspective of a cost advantage that leads to a larger storage capacity for the same number of elements is obtained in MLC, compared with Single Level Cell (SLC) in which data of 2 values (or 1 bit) is stored in each memory element. Hereinafter, in the present specification, a scheme in which data of 2 values (or 1 bit) is stored in each memory element is referred to as SLC scheme, a scheme in which data of 4 values (or 2 bits) is stored in each memory element is referred to as MLC scheme, and a scheme in which data of 8 values (or 3 bits) is stored in each memory element is referred to as Triple Level Cell (TLC) scheme. For example, when the TLC scheme is applied, a capacity is increased four times (in terms of the amount of information), compared with the SLC scheme for the same number of elements.

When memory elements are miniaturized and the number of bits of data to be stored in each memory element is increased, an acceptable number of times of writing in each memory element is reduced. For example, an acceptable number of times of rewriting in each memory element in a single certain manufacturing process is the largest in the SLC scheme, and is the second largest in the MLC scheme, and is the smallest in the TLC scheme. In addition, the speed of writing data in each memory element in the TLC scheme is lower than that in the SLC, since a threshold voltage is finely controlled in the TLC scheme. As described above, the SLC is more superior in terms of the reliability and the writing speed than the TLC, while the TLC is more superior in terms of the cost advantage than the SLC. Thus, in recent years, the TLC scheme has been used in many cases. As methods of improving the reliability and the writing speed, the aforementioned process of averaging the numbers of times of writing, garbage collection, a parallel writing method, and the like are used. In addition, a technique for writing data in a binary value region within a memory from an external, transferring the data from the binary value region to a multivalued region within the memory after the writing, and improving the writing speed for the external has been proposed.

A certain SSD, which has a main storage region 801 and a redundant region 802 as illustrated in FIG. 8 and executes control to average the numbers of times of writing in memory elements, executes control to logically switch a memory element of the main storage region 801 with a memory element of the redundant region 802 before the end of the life of the memory element of the main storage region 801. A storage capacity of each of blocks BLK1 to BLKn of the main storage region 801 is equal to a storage capacity of each of redundant blocks RBLK1 to RBLKn of the redundant region 802. The aforementioned switching control is executed on a block basis. For example, if the number of times of writing in a memory element within the block BLK2 of the main storage region 801 exceeds a predetermined number or if the number of errors increases, control is executed to use one redundant block (redundant block RBLK1 in this example) of the redundant region 802 as the block BLK2. After this switching control is executed, the block BLK2 of the main storage region 801 is set to a defective block and is not accessed.

A technique has been proposed, which is to switch an operational mode of a memory chip in which data of n bits is stored in each memory element from an operational mode for storing data of n bits in each of all memory elements to an operational mode for storing data of m (m<n) bits in each of the memory elements if the number of blocks set to defective blocks after the initial use exceeds a predetermined threshold. However, when the operational mode is switched, the actual storage capacity of the memory chip is reduced to m/n of the original capacity.

As described above, if the main storage region and the other redundant region exist and a certain block of the main storage region has become defective, the control is executed to switch the defective block with a redundant block included in the redundant region and having the same size as the defective block, but the switched defective block of the main storage region is not used after the switching.

The followings are reference documents.
[Document 1] Japanese Laid-open Patent Publications No. 2011-28793 and
[Document 2] Japanese Laid-open Patent Publications No. 2008-123330.

SUMMARY

According to an aspect of the invention, a control circuit that controls a memory including a storage region and a redundant region, the control circuit includes a detector that detects a defective block in the memory, and a controller that switches, when the detector has detected the defective block, a data storage scheme of the first block detected as the defective block from a first storage scheme to a second storage scheme in which the number of bits of data to be stored in each of memory elements is smaller than the number of bits of data to be stored in each of the memory elements in the first storage scheme, and that stores a portion of data stored in the first block in the first storage scheme to be stored in the first block in the second storage scheme and stores the remaining portion of the data stored in the first block in the first storage scheme to be stored in a second block of the redundant region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are diagrams describing an example of a recovery method of the semiconductor storage device according to the embodiment;

FIG. 8 is a diagram describing a recovery method of a conventional semiconductor storage device.

DESCRIPTION OF EMBODIMENT

An embodiment is described with reference to the accompanying drawings. Hereinafter, as a semiconductor storage device according to the embodiment, a solid state drive (SSD) that uses a flash memory that is one of nonvolatile memories is exemplified. The embodiment, however, is not limited to the SSD and applicable to a semiconductor storage device using a nonvolatile memory.

Figure 9A:
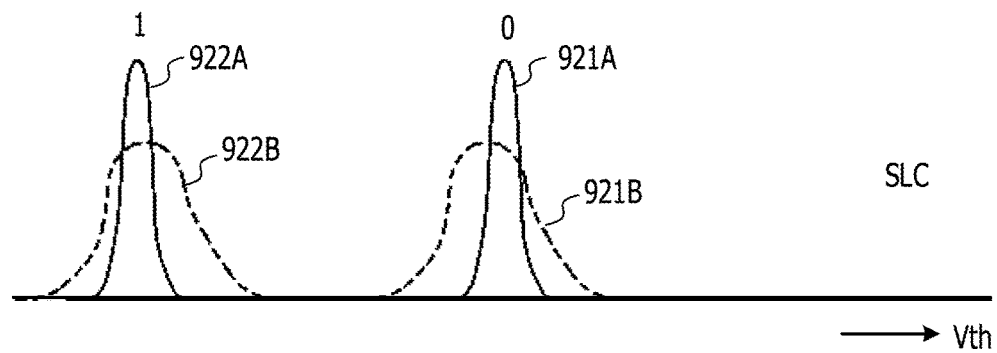
FIGS. 9A, 9B, and 9C are diagrams illustrating an example of threshold voltage distributions of nonvolatile memory elements.
Figure 9B:
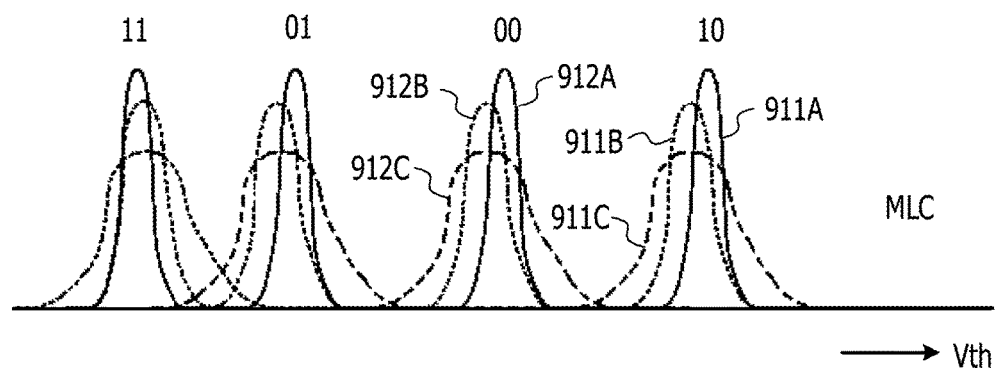
Figure 9C:
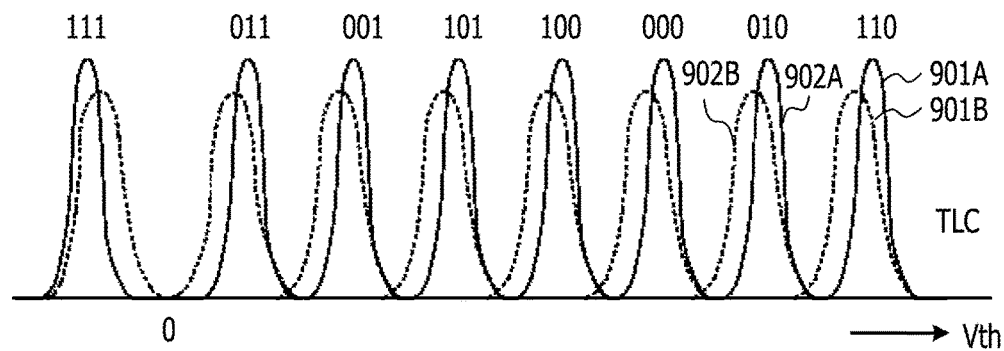

FIGS. 9A to 9C are diagrams illustrating an example of threshold voltage distributions of nonvolatile memory elements. In each of FIGS. 9A to 9C, an abscissa indicates a threshold voltage Vth, and an ordinate indicates the number of elements. FIG. 9A illustrates an example of distributions of threshold voltages Vth in the Signal Level Cell (SLC) scheme. FIG. 9B illustrates an example of distributions of threshold voltages Vth in the Multiple Level Cell (MLC) scheme. FIG. 9C illustrates an example of distributions of threshold voltages Vth in the Triple Level Cell (TLC) scheme. In the SLC scheme, data of 2 values (or 1 bit) is stored in each memory element. In the MLC scheme, data of 4 values (or 2 bits) is stored in each memory element. In the TLC scheme, data of 8 values (or 3 bits) is stored in each memory element.

In the TLC scheme illustrated in FIG. 9C, when the numbers of times of writing of data in memory elements are small, variations in the threshold voltages Vth are small as indicated in solid lines 901A and 902A, and data values may be appropriately determined. After that, however, when data writing and data deletion are repeatedly executed, the variations in the threshold voltages Vth increase as indicated by dotted lines 901B and 902B, and the data values are not appropriately determined.

In the MLC scheme illustrated in FIG. 9B, when the numbers of times of writing in memory elements are small, variations in the threshold voltages Vth are small as indicated by solid lines 911A and 912A, and data values may be appropriately determined. After that, when data writing and data deletion are repeatedly executed, the variations in the threshold voltages Vth increase to levels equal or close to the levels indicated by the dotted lines 901B and 902B in FIG. 9C and do not overlap each other, as indicated by dotted lines 911B and 912B, and the data values may be appropriately determined in the MLC scheme. After that, when data writing and data deletion are repeatedly executed, the variations in the threshold voltages Vth increase as indicated by broken lines 911C and 912C, and the data values are not appropriately determined.

In the SLC scheme illustrated in FIG. 9A, when the numbers of times of writing of data in memory elements are small, variations in the threshold voltages Vth are small as indicated by solid lines 921A and 922A, and data values may be appropriately determined. After that, even when data writing and data deletion are repeatedly executed, variations in the threshold voltages Vth increase to levels equal or close to levels indicated by broken lines 911C and 912C in FIG.

9B and do not overlap each other, and the data values may be appropriately determined in the SLC scheme.

Even if the scheme for storing data is the TLC scheme, and data values are not appropriately determined in the TLC scheme, the data values may be appropriately determined in the MLC scheme in some cases. In addition, even if data values are not appropriately determined in the MLC scheme, the data values may be appropriately determined in the SLC scheme. In the embodiment, if a block storing data in the TLC scheme becomes defective, the block is not discarded and is switched to store data in the MLC scheme and is reused. If a block storing data in the MLC scheme becomes defective, the block is not discarded and is switched to store data in the SLC scheme and is reused. Specifically, if a block of the main storage region becomes defective, the block is not discarded and is used by executing control to reduce the number of bits of data stored in each memory element.

Figure 1:
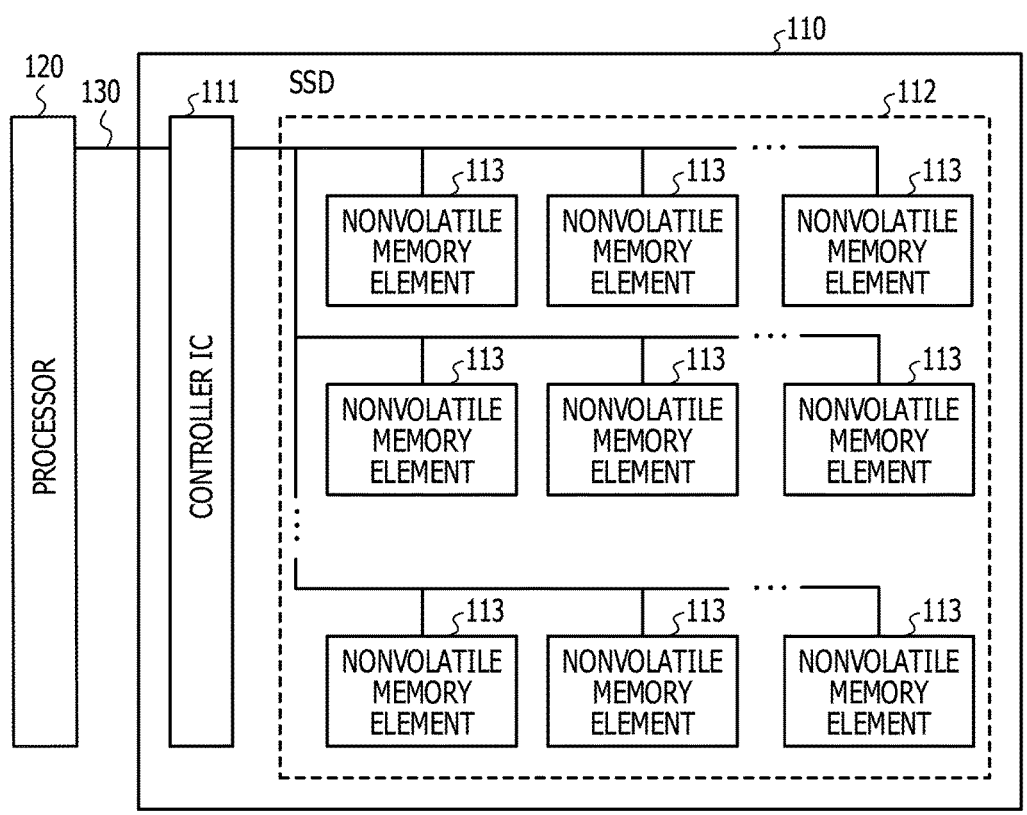
FIG. 1 is a diagram illustrating a configuration example of a semiconductor storage device according to an embodiment.

FIG. 1 is a block diagram illustrating a configuration example of the SSD as the semiconductor storage device according to the embodiment. The SSD 110 according to the embodiment includes a controller IC 111 as a control circuit according to the embodiment and a memory section 112. The controller IC 111 is connected to and communicates with a processor 120 via a connection interface 130 such as Serial AT Attachment (SATA), Peripheral Component Interconnect Express (PCI express or PCIe), or Non-Volatile Memory Express (NVMe), for example. The controller IC 111 accesses the memory section 112 and writes, reads, and deletes data in accordance with instructions from the processor 120 or the like and executes another operation in accordance with an instruction from the processor 120 or the like.

The memory section 112 includes a plurality of nonvolatile memory elements 113. The memory section 112 has a main storage region having a plurality of blocks and a redundant region having a plurality of blocks. Data stored in the memory section 112 is deleted on a block basis. The processor 120 is an example of a host device that accesses the SSD 110. The SSD 110 may be connected to and communicate with another device via the connection interface 130.

Figure 2:
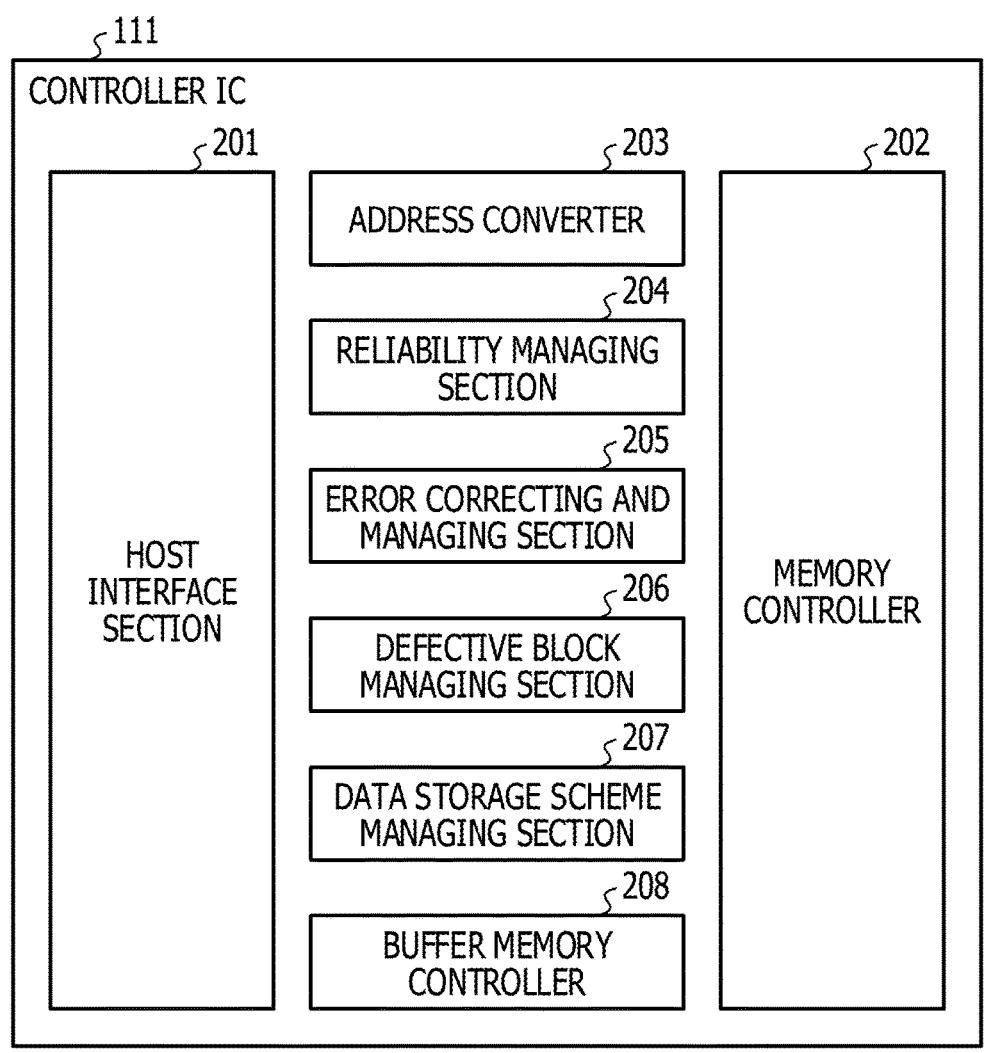
FIG. 2 is a diagram illustrating a configuration example of a controller according to the embodiment.

FIG. 2 is a block diagram illustrating a configuration example of the controller IC 111 according to the embodiment. The controller IC 111 includes a host interface section 201, a memory controller 202, an address converter 203, a reliability managing section 204, an error correcting and managing section 205, a defective block managing section 206, a data storage scheme managing section 207, and a buffer memory controller 208.

The host interface section 201 transmits and receives data (signals) to and from the host device such as the processor 120 via the connection interface 130. The memory controller 202 transmits and receives data (signals) to and from the nonvolatile memory elements 113 included in the memory section 112 and executes control related to the nonvolatile memory elements 113.

The address converter 203 converts logical addresses input via the host interface section 201 to physical addresses allocated to the nonvolatile memory elements 113 included in the memory section 112. Specifically, the address converter 203 converts addresses output by the host device such as the processor 120 to internal addresses within the SSD 110. The reliability managing section 204 manages the number of times of data deletion (data rewriting) for each of blocks included in the memory section 112. In addition, the reliability managing section 204 executes wear leveling to average the numbers of times of writing in the memory elements of the memory section 112 or the like.

The error correcting and managing section 205 executes an error correction process on data read from the memory section 112 and manages addresses at which data errors have been detected, the types of the errors, the number of times when the errors have been detected, and the like. Details of the error correction process are not limited, but a known error detection and correction method may be applied to the error correction process.

The defective block managing section 206 executes a process of detecting a defective block in the memory section 112 and manages information indicating defective blocks. For example, the defective block managing section 206 holds, for each of the blocks included in the memory section 112, information indicating whether or not the block is a defective block. For example, the defective block managing section 206 detects a defective block based on error correction states indicating the numbers of times of deletion from the blocks BLK1 to BLKn managed by the reliability managing section 204, error types managed by the error correcting and managing section 205, the numbers, managed by the error correcting and managing section 205, of times when the errors have been detected, and the like. The detection of a defective block is not limited to this and may be executed together with estimation logic for determining whether or not a block is likely to become defective or the like.

The data storage scheme managing section 207 controls and manages schemes for storing data in the nonvolatile memory elements 113 for each of blocks included in the memory section 112. For example, the data storage scheme managing section 207 switches a data storage scheme of a block that has become defective, and the data storage scheme managing section 207 controls data writing and data writing back for the switching of the data storage scheme. The buffer memory controller 208 controls a buffer memory (not illustrated) that holds data to be written in the nonvolatile memory elements 113 included in the memory section 112 and data read from the nonvolatile memory elements 113 included in the memory section 112.

Figure 4:
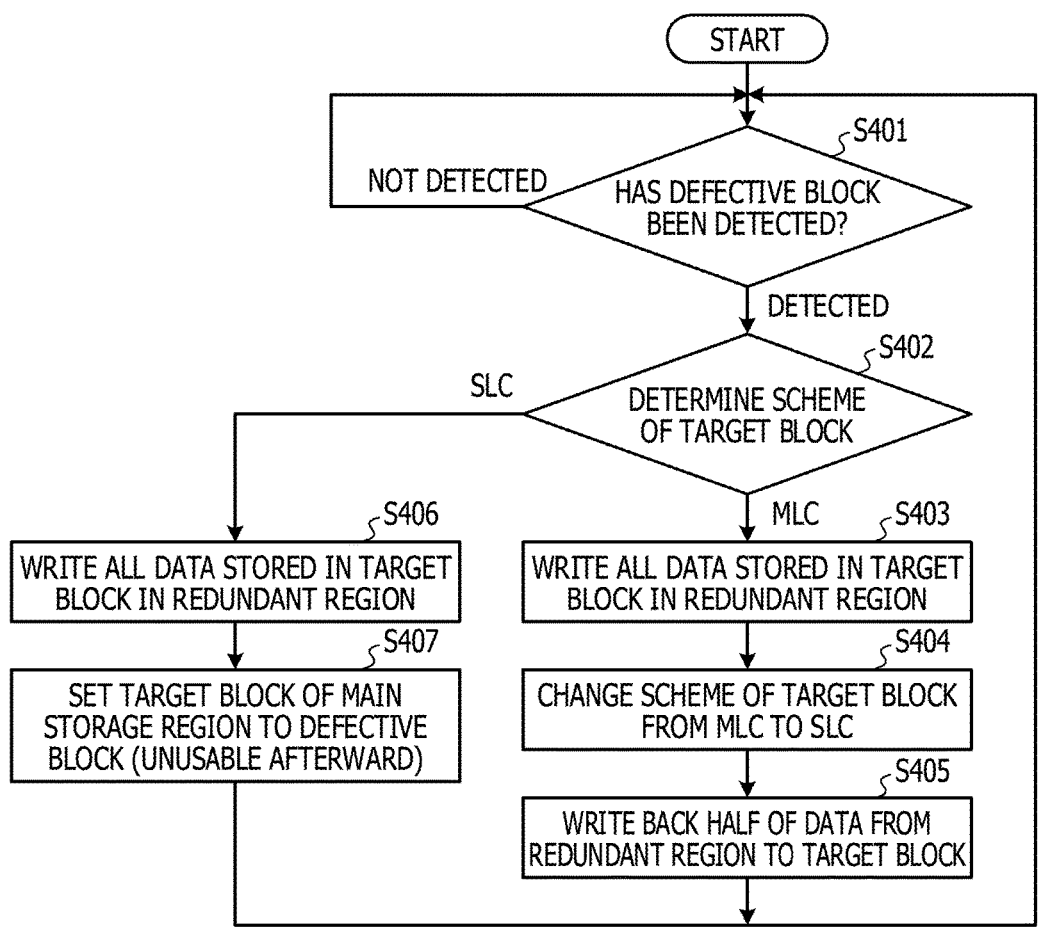
FIG. 4 is a flowchart of an example of operations of the semiconductor storage device according to the embodiment.

Next, a first example of a recovery method of the SSD 110 according to the embodiment is described with reference to FIGS. 3A, 3B, and 4. FIGS. 3A and 3B are diagrams describing the first example of the recovery method of the SSD 110 according to the embodiment. FIG. 4 is a flowchart of an example of operations related to the recovery method of the SSD 110 according to the embodiment. In the first example described below, if a block storing data in the MLC scheme becomes defective, the data storage scheme of the block is switched to the SLC scheme and the block is used.

The memory section 112 includes a main storage region 301 and a redundant region 302 as storage regions, as illustrated in FIG. 3A. It is assumed that the main storage region 301 includes blocks BLK1 to BLKn and that the redundant region 302 includes redundant blocks RBLK1 to RBLK6. In an initial state, data storage schemes of the blocks BLK1 to BLKn and the redundant blocks RBLK1 to RBLK6 are the MLC scheme, and data of 4 values (or 2 bits) is stored in each of the nonvolatile memory elements. The size (storage capacity) of each of the redundant blocks RBLK1 to RBLK6 is equal to or larger than a half of the size of each of the blocks BLK1 to BLKn, and preferably equal to a half of the size of each of the blocks BLK1 to BLKn.

When the SSD 110 according to the embodiment starts operating, the controller IC 111 accesses the memory section 112 in accordance with an instruction from the host device such as the processor 120. In the first example, the controller IC 111 starts the operations related to the recovery method illustrated in FIG. 4 in response to the start of the operation of the SSD 110.

In step S401, the controller IC 111 determines whether or not a defective block has been detected in the main storage region 301 of the memory section 112. If the controller IC 111 determines that the defective block has been detected, the process proceeds to step S402. In step S402, the controller IC 111 determines the data storage scheme of the target block detected as the defective block. In the first example, the controller IC 111 determines whether the data storage scheme of the target block is the MLC scheme or the SLC scheme.

If the controller IC 111 determines that the data storage scheme of the target block is the MLC scheme in step S402, the controller IC 111 writes all data stored in the target block in unused blocks of the redundant region 302 in step S403. Specifically, the controller IC 111 selects two redundant blocks from among unused blocks of the redundant region 302 and writes, in the selected redundant blocks, all the data stored in the target block detected as the defective block and included in the main storage region 301.

Next, in step S404, the controller IC 111 deletes the data from the target block detected as the defective block and changes the data storage scheme of the target block from the MLC scheme to the SLC scheme in which data of 2 values (or 1 bit) is stored in each nonvolatile memory element. Subsequently, in step S405, the controller IC 111 writes back a half of the data previously stored in the target block and written in the redundant blocks in step S403 to the target block. Specifically, the controller IC 111 writes back a half of the data to the target block from one of the redundant blocks in which all the data has been written in step S403, and sets the one redundant block to an unused state. Then, the process returns to step S401.

If the controller IC 111 determines that the data storage scheme of the target block is the SLC scheme in step S402, the controller IC 111 writes all data stored in the target block in an unused block of the redundant region 302 in step S406. Specifically, the controller IC 111 selects a single redundant block from among unused blocks of the redundant region 302 and writes, in the selected redundant block, all the data stored in the target block detected as the defective block and included in the main storage region 301. Next, in step S407, the controller IC 111 sets the target block detected as the defective block and included in the main storage region 301 to a defective block and stores the target block to be unusable afterward. Then, the process returns to step S401.

For example, it is assumed that the block BLK2 storing data in the MLC scheme and included in the main storage region 301 illustrated in FIG. 3A becomes defective. In this case, as illustrated in FIG. 3B, the controller IC 111 writes the data stored in the block BLK2 of the main storage region 301 in, for example, the redundant blocks RBLK1 and RBLK2 of the redundant region 302 and changes the data storage scheme of the block BLK2 of the main storage region 301 to the SLC scheme. After that, the controller IC 111 writes back data written in the redundant block RBLK2 of the redundant region 302 to the block BLK2 of the main storage region 301.

In this manner, the controller IC 111 of the SSD 110 changes a data storage scheme of a block detected as a defective block from the MLC scheme to the SLC scheme, stores a portion of data stored in the block detected as the defective block to be stored in the target block in the SLC scheme, and stores the remaining portion of the data to be stored in a redundant block of the redundant region 302 in the MLC scheme. Thus, even a block detected as a defective block is not discarded and may be reused, memory elements of the main storage region may be effectively used, and the life of the SSD 110 may be extended. In addition, since only a portion that is included in data stored in a target block detected as a defective block and is not stored in the target block due to the switching from the MLC scheme to the SLC scheme is stored in a redundant block of the redundant region, the redundant region to be used for the recovery method may be reduced, compared with conventional techniques.

Figures 5A, 5B, 5C:
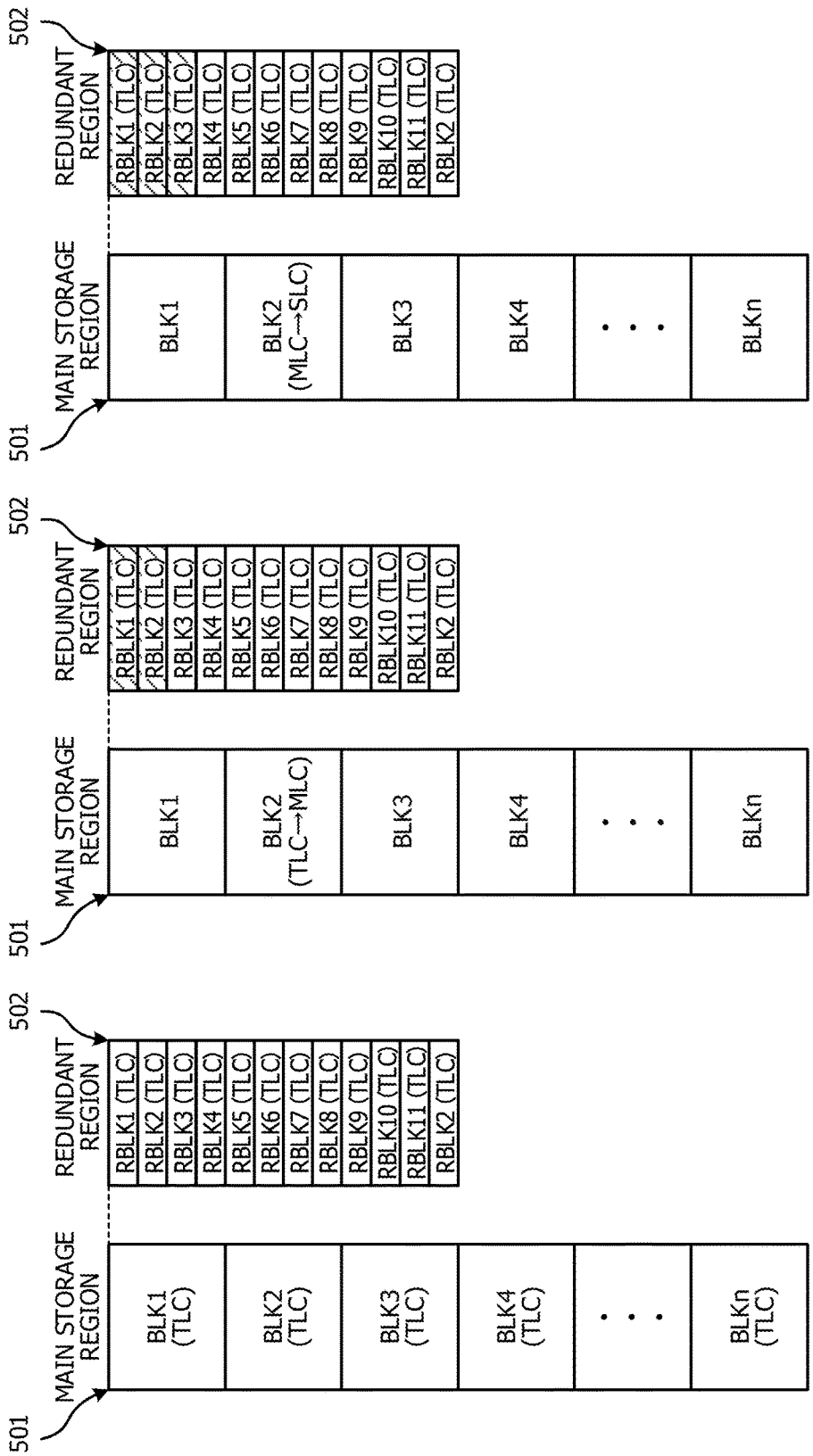
FIGS. 5A, 5B, and 5C are diagrams describing an example of the recovery method of the semiconductor storage device according to the embodiment.
Figure 6:
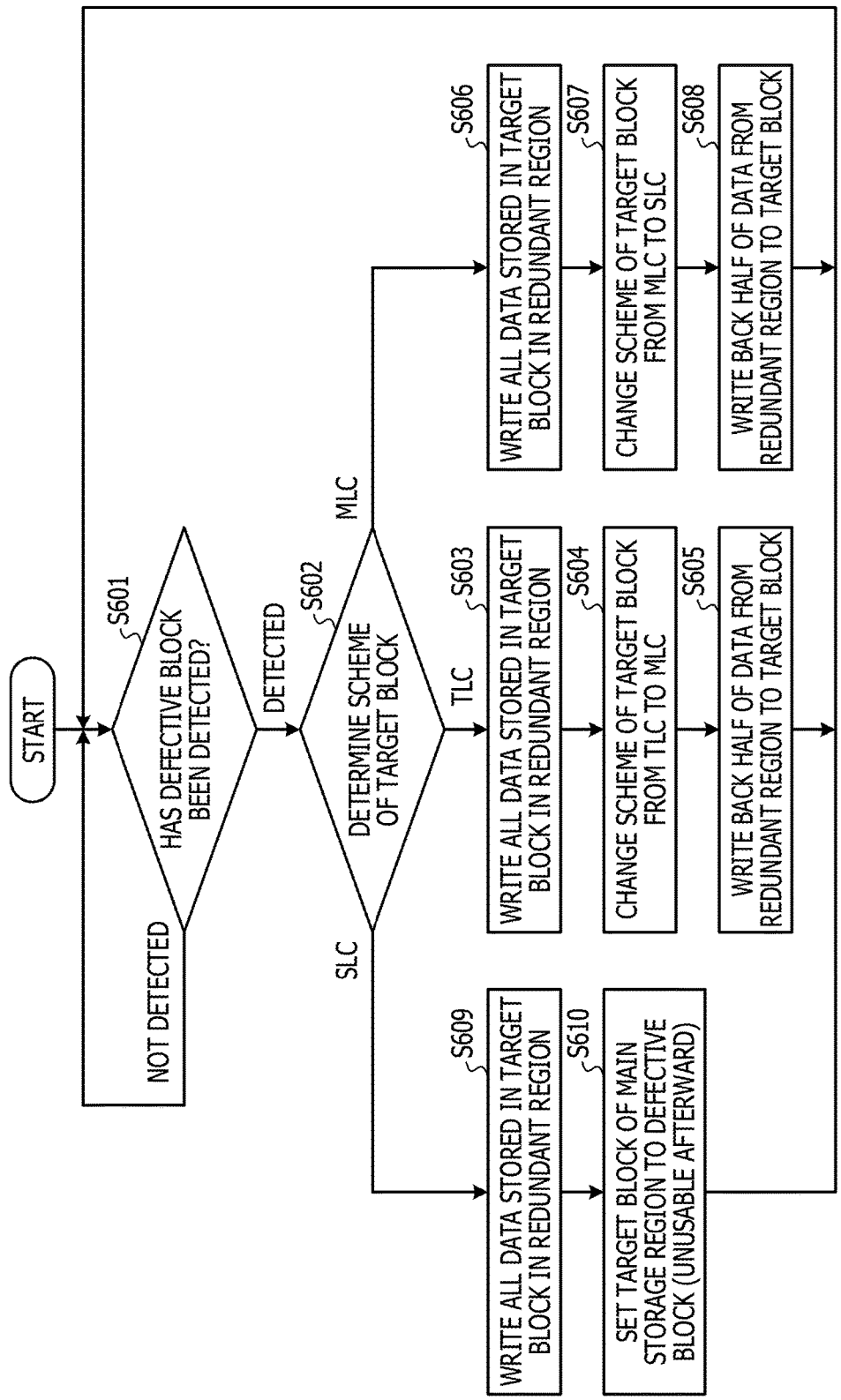
FIG. 6 is a flowchart of an example of operations of the semiconductor storage device according to the embodiment.
Figure 7A:
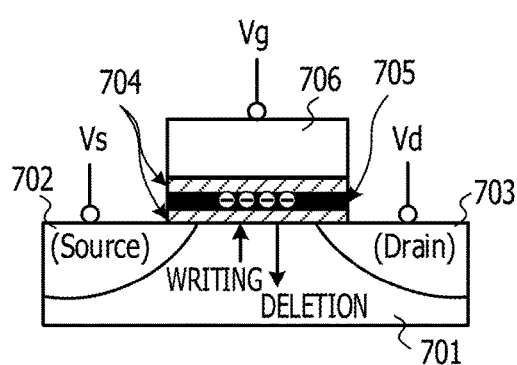
FIGS. 7A and 7B are diagrams describing each of nonvolatile memory elements.
Figure 7B:
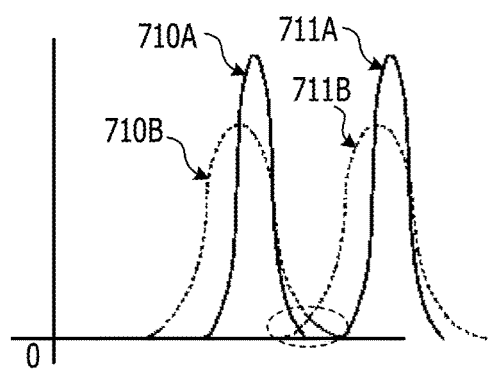

Next, a second example of the recovery method of the SSD 110 according to the embodiment is described with reference to FIGS. 5A, 5B, 5C, and 6. FIGS. 5A, 5B, and 5C are diagrams describing the second example of the recovery method of the SSD 110 according to the embodiment. FIG. 6 is a flowchart of an example of operations related to the recovery method of the SSD 110 according to the embodiment. In the second example described below, if a block storing data in the TLC scheme becomes defective, the data storage scheme of the block is switched from the TLC scheme to the MLC scheme and the block is used, and if the block storing data in the switched MLC scheme becomes defective, the data storage scheme of the block is switched from the MLC scheme to the SLC scheme and the block is used.

The memory section 112 includes a main storage region 501 and a redundant region 502 as storage regions, as illustrated in FIG. 5A. It is assumed that the main storage region 501 includes blocks BLK1 to BLKn and that the redundant region 502 includes redundant blocks RBLK1 to RBLK12. In an initial state, data storage schemes of the blocks BLK1 to BLKn and data storage schemes of the redundant blocks RBLK1 to RBLK12 are the TLC scheme, and data of 8 values (or 3 bits) is stored in each of the nonvolatile memory elements. The size (storage capacity) of each of the redundant blocks RBLK1 to RBLK12 is equal to or larger than one fourth of the size of each of the blocks BLK1 to BLKn, and preferably equal to one fourth of the size of each of the blocks BLK1 to BLKn.

When the SSD 110 according to the embodiment starts operating, the controller IC 111 accesses the memory section 112 in accordance with an instruction from the host device such as the processor 120. In the second example, the controller IC 111 starts the operations related to the recovery method illustrated in FIG. 6 in response to the start of the operation of the SSD 110.

In step S601, the controller IC 111 determines whether or not a defective block has been detected in the main storage region 501 of the memory section 112. If the controller IC 111 determines that the defective block has been detected, the process proceeds to step S602. In step S602, the controller IC 111 determines the data storage scheme of the target block detected as the defective block. In the second example, the controller IC 111 determines whether the data storage scheme of the target block is the TLC scheme, the MLC scheme, or the SLC scheme.

If the controller IC 111 determines that the data storage scheme of the target block is the TLC scheme in step S602, the controller IC 111 writes all data stored in the target block in unused blocks of the redundant region 502 in step S603. Specifically, the controller IC 111 selects four redundant blocks from among unused blocks of the redundant regions 502 and writes, in the selected redundant blocks, all the data stored in the target block detected as the defective block and included in the main storage region 501.

Next, in step S604, the controller IC 111 deletes the data from the target block detected as the defective block and changes the data storage scheme of the target block from the TLC scheme to the MLC scheme in which data of 4 values (or 2 bits) is stored in each nonvolatile memory element. Sequentially, in step S605, the controller IC 111 writes back a half of the data previously stored in the target block and written in the redundant blocks in step S603 to the target block. Specifically, the controller IC 111 writes back a half of the data to the target block from two of the four redundant blocks in which the data has been written in step S603, and sets the two redundant blocks to unused states. Then, the process returns to step S601.

If the controller IC 111 determines that the data storage scheme of the target block is the MLC scheme in step S602, the controller IC 111 writes all data stored in the target block in unused blocks of the redundant region 502 in step S606. Specifically, the controller IC 111 selects two redundant blocks from among unused blocks of the redundant region 502 and writes, in the selected redundant blocks, all the data stored in the target block detected as the defective block and included in the main storage region 501.

Next, in step S607, the controller IC 111 deletes the data from the target block detected as the defective block and changes the data storage scheme of the target block from the MLC scheme to the SLC scheme in which data of 2 values (or 1 bit) is stored in each nonvolatile memory element. Subsequently, in step S608, the controller IC 111 writes back a half of the data previously stored in the target block and written in the redundant blocks in step S606 to the target block. Specifically, the controller IC 111 writes back a half of the data to the target block from one of the two redundant blocks in which the data has been written in step S606, and sets the redundant block to an unused state. Then, the process returns to step S601.

If the controller IC 111 determines that the data storage scheme of the target block is the SLC scheme in step S602, the controller IC 111 writes all data stored in the target block in an unused block of the redundant region 502 in step S609. Specifically, the controller IC 111 selects a single redundant block from among unused blocks of the redundant region 502 and writes, in the selected redundant block, all the data stored in the target block detected as the defective block and included in the main storage region 501. Next, in step S610, the controller IC 111 sets the target block detected as the defective block and included in the main storage region 501 to a defective block and stores the target block to be unusable afterward. Then, the process returns to step S601.

For example, it is assumed that the block BLK2 storing data in the TLC scheme and included in the main storage region 501 illustrated in FIG. 5A becomes defective. In this case, as illustrated in FIG. 5B, the controller IC 111 writes the data stored in the block BLK2 of the main storage region 501 in, for example, the redundant blocks RBLK1 and RBLK4 of the redundant region 502 and changes the data storage scheme of the block BLK2 of the main storage region 501 to the MLC scheme. After that, the controller IC 111 writes back data written in the redundant blocks RBLK3 and RBLK4 of the redundant region 302 to the block BLK2 of the main storage region 501.

In addition, it is assumed that the block BLK2 storing the data in the switched MLC scheme and included in the main storage region 501 illustrated in FIG. 5B becomes defective. In this case, as illustrated in FIG. 5C, the controller IC 111 writes the data stored in the block BLK2 of the main storage region 501 in, for example, the redundant blocks RBLK3 and RBLK4 of the redundant region 502 and changes the data storage scheme of the block BLK2 of the main storage region 501 to the SLC scheme. After that, the controller IC 111 writes back data written in the redundant block RBLK4 of the redundant region 502 to the block BLK2 of the main storage region 501.

In this manner, the controller IC 111 of the SSD 110 switches a data storage scheme of a block detected as a defective block from the TLC scheme to the MLC scheme, stores a portion of data stored in the block detected as the defective block to be stored in the target block in the MLC scheme, and stores the remaining portion of the data to be stored in redundant blocks of the redundant region 502 in the TLC scheme. In addition, if the block storing the data in the switched MLC scheme becomes defective, the controller IC 111 switches the data storage scheme of the target block from the MLC scheme to the SLC scheme, stores a portion of the data stored in the target block detected as the defective block to be stored in the target block in the SLC scheme, and stores the remaining portion of the data to be stored in a redundant block of the redundant region 502 in the TLC scheme.

In the second example, even a block detected as a defective block is not discarded and may be reused, memory elements of the main storage region may be effectively used, and the life of the SSD may be extended. Since only a portion that is included in data stored in a target block detected as a defective block and is not stored in the target block due to the switching of a data storage scheme is stored in a redundant block of the redundant region, the redundant region to be used for the recovery method may be reduced, compared with the conventional techniques.

The aforementioned embodiment describes the example in which the SLC scheme, the MLC scheme, and the TLC scheme are used as the data storage schemes of the blocks, but is not limited to this. For example, a Quadruple Level Cell (QLC) scheme in which data of 16 values (or 4 bits) is stored in each memory element may be used, and the data storage schemes may be switched from the QLC scheme through the TLC scheme and the MLC scheme to the SLC scheme. The embodiment is not limited to the aforementioned examples. If a certain block becomes defective, control is executed to avoid discarding the block, reduce the number of bits of data to be stored in each memory element, and reuse the block. Thus, the block that has become defective may be reused.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A control circuit that controls a memory including a storage region and a redundant region, the control circuit comprising:
 a detector that detects a defective block in the memory; and
 a controller that switches, when the detector has detected the defective block, a data storage scheme of the first block detected as the defective block from a first storage scheme to a second storage scheme in which the number of bits of data to be stored in each of memory elements is smaller than the number of bits of data to be stored in each of the memory elements in the first storage scheme, and that stores a portion of data stored in the first block in the first storage scheme to be stored in the first block in the second storage scheme and stores the remaining portion of the data stored in the first block in the first storage scheme to be stored in a second block of the redundant region, the controller writes all the data stored in the first block in the first storage scheme in the second block of the redundant region and a third block of the redundant region, switches the data storage scheme of the first block from the first storage scheme to the second storage scheme, and writes back data written in the third block of the redundant region to the first block in the second storage scheme after the switching of the data storage scheme.

2. The control circuit according to claim 1, wherein the number of bits to be stored in each of the memory elements in the second storage scheme is smaller by 1 bit than the number of bits to be stored in each of the memory elements in the first storage scheme.

3. The control circuit according to claim 1, wherein data of 2 bits is to be stored in each of the memory elements in the first storage scheme, while data of 1 bit is to be stored in each of the memory elements in the second storage scheme.

4. The control circuit according to claim 1, wherein data of 3 bits is to be stored in each of the memory elements in the first storage scheme, while data of 2 bits is to be stored in each of the memory elements in the second storage scheme.

5. The control circuit according to claim 1,
wherein a storage capacity of each of blocks of the redundant region in the first storage scheme is equal to a half of a storage capacity of each of blocks of the storage region in the first storage scheme, and
wherein the controller stores data to be stored in the blocks of the redundant region in the first storage scheme.

6. The control circuit according to claim 1, wherein the memory elements of the memory are nonvolatile memory elements.

7. The control circuit according to claim 1, wherein when the detector has detected, as the defective block, the first block storing the data in the switched second storage scheme, the controller stores all the data stored in the first block to be stored in a block of the redundant region and stores the first block to be unusable.

8. The control circuit according to claim 1, wherein when the detector has detected, as the defective block, the first block storing the data in the switched second storage scheme, the controller switches the data storage scheme of the first block from the second storage scheme to a third storage scheme in which the number of bits of data to be stored in each of the memory elements is smaller than the number of bits of data to be stored in each of the memory elements in the second storage scheme, and the controller stores a portion of the data stored in the first block in the second storage scheme to be stored in the first block in the third storage scheme and stores the remaining portion of the data stored in the first block in the second storage scheme to be stored in a third block of the redundant region.

9. The control circuit according to claim 8, wherein data of 3 bits is to be stored in each of the memory elements in the first storage scheme, data of 2 bits is to be stored in each of the memory elements in the second storage scheme, and data of 1 bit is to be stored in each of the memory elements in the third storage scheme.

10. The control circuit according to claim 8, wherein a storage capacity of each of blocks of the redundant region in the first storage scheme is equal to one fourth of a storage capacity of each of blocks of the storage region in the first storage scheme.

11. The control circuit according to claim 8, wherein when the detector has detected, as the defective block, the first block storing the data in the switched third storage scheme, the controller stores all the data stored in the first block to be stored in a block of the redundant region and stores the first block to be unusable.

12. A semiconductor storage device comprising:
a memory that includes a storage region and a redundant region; and
a control circuit that controls the memory, the control circuit includes
a detector that detects a defective block in the memory, and
a controller that switches, when the detector has detected the defective block, a data storage scheme of the first block detected as the defective block from a first storage scheme to a second storage scheme in which the number of bits of data to be stored in each of memory elements is smaller than the number of bits of data to be stored in each of the memory elements in the first storage scheme, and that stores a portion of data stored in the first block in the first storage scheme to be stored in the first block in the second storage scheme and stores the remaining portion of the data stored in the first block in the first storage scheme to be stored in a second block of the redundant region,
the controller writes all the data stored in the first block in the first storage scheme in the second block of the redundant region and a third block of the redundant region, switches the data storage scheme of the first block from the first storage scheme to the second storage scheme, and writes back data written in the third block of the redundant region to the first block in the second storage scheme after the switching of the data storage scheme.

13. A method of controlling a semiconductor storage device including a memory that includes a storage region and a redundant region, comprising:
when a control circuit of the semiconductor storage device determines whether or not the control circuit has detected a defective block in the memory, and the control circuit has detected the defective block, causing the control circuit to switch a data storage scheme of the first block detected as the defective block from a first storage scheme to a second storage scheme in which the number of bits of data to be stored in each of memory elements is smaller than the number of bits of data to be stored in each of the memory elements in the first storage scheme;
causing the control circuit to store a portion of data stored in the first block in the first storage scheme to be stored in the first block in the second storage scheme; and
causing the control circuit to store the remaining portion of the data stored in the first block in the first storage scheme to be stored in a second block of the redundant region,
when the control circuit has detected the defective block, causing the control circuit to write all the data stored in the first block in the first storage scheme in the second block of the redundant region and a third block of the redundant region;

causing, after the writing, the control circuit to switch the data storage scheme of the first block from the first storage scheme to the second storage scheme; and causing, after the switching of the data storage scheme, the control circuit to write back data written in the third block of the redundant region to the first block in the second storage scheme.

* * * * *